United States Patent
Ou Yang et al.

(10) Patent No.: US 6,980,434 B2
(45) Date of Patent: Dec. 27, 2005

(54) COMPUTER FAN ASSEMBLY MECHANISM HAVING FILTERING AND STERILIZING FUNCTIONS

(76) Inventors: Chieh Ou Yang, No. 22, Alley 47, Lane 115, Sec. 2, Cheng Kung Rd., Taipei (TW); Wei Ou Yang, No. 24, Alley 47, Lane 115, Sec. 2, Cheng Kung Rd., Taipei (TW)

( * ) Notice: Subject to any disclaimer, the term of this patent is extended or adjusted under 35 U.S.C. 154(b) by 280 days.

(21) Appl. No.: 10/689,684

(22) Filed: Oct. 22, 2003

(65) Prior Publication Data

US 2005/0088817 A1      Apr. 28, 2005

(51) Int. Cl.⁷ .............................................. H05K 7/20
(52) U.S. Cl. ...................... 361/695; 361/687; 454/184; 422/4; 422/24; 422/186.3
(58) Field of Search ................................ 361/687, 694, 361/695; 422/4, 24, 121, 168, 177, 186.3; 454/184; 96/223, 224; 55/423, 479, 524, 55/481, 471, 385.6; 210/209, 493.5, 499

(56) References Cited

U.S. PATENT DOCUMENTS

| | | | | |
|---|---|---|---|---|
| 4,750,917 A | * | 6/1988 | Fujii ............................... | 95/69 |
| 5,223,006 A | * | 6/1993 | Moran, III ...................... | 96/18 |
| 6,462,947 B1 | * | 10/2002 | Huang .......................... | 361/695 |
| 6,754,077 B2 | * | 6/2004 | Lo et al. ...................... | 361/700 |
| 2005/0013751 A1 | * | 1/2005 | Huang et al. ............. | 422/186.3 |

\* cited by examiner

*Primary Examiner*—Michael Datskovskiy
(74) *Attorney, Agent, or Firm*—Rosenberg, Klein & Lee

(57) ABSTRACT

A computer fan assembly mechanism having filtering and sterilizing functions comprises a fan body. An air passageway is formed at a hollow portion in the fan body. The air passageway has an intake and an air vent, which corresponds to the fan, is located on the fan body. A photo-catalytic net is disposed at the intake. One or more UV LEDs are disposed on the air passageway to illuminate the photo-catalytic net. Through illumination of the UV LED onto the photo-catalytic net, the object of filtering and sterilizing air passing the intake can be accomplished.

4 Claims, 8 Drawing Sheets

COMPUTER FAN ASSEMBLY MECHANISM HAVING FILTERING AND STERILIZING FUNCTIONS

FIELD OF THE INVENTION

The present invention relates to a computer fan assembly mechanism having filtering and sterilizing functions and, more particularly, to a computer fan assembly mechanism making use of an ultraviolet (UV) LED to illuminate a photo-catalytic net for filtering and sterilizing air passing its intake.

BACKGROUND OF THE INVENTION

A conventional computer mainly uses an extractor fan located on its power supply for heat-radiation. The extractor fan starts to suck exterior air to the inside of the computer via a preset through hole on the computer. The air sucked in passes motherboard, hard disk, floppy disk, CPU, CD-ROM drive and so on, enters the power supply, and then is discharged out by the extractor fan. Although heat-radiating effect is accomplished, dust mites in air are also sucked into the computer and stay on various kinds of electronic components and the circuit. After accumulation for a long time, the heat-radiating effect of the circuit will be affected, and current leakage between electrodes of the circuit may easily arise due to humidity in air, hence letting the computer easily crash during operation at a high speed. More particularly, because the operation speed of a CPU becomes faster, the demand for heat-radiating effect is higher. The way of only using an extractor fan on the power supply for heat radiation cannot meet today's requirements. Accordingly, the above extractor fan of the conventional computer has inconvenience and drawbacks in practical use. The present invention aims to resolve the problems in the prior art.

SUMMARY OF THE INVENTION

The primary object of the present invention is to provide a computer fan assembly mechanism having filtering and sterilizing functions, which can filter and sterilize air passing its intake to prevent dusts from accumulating on the circuit board of a computer, hence enhancing the heat-radiating efficiency of the computer.

To achieve the above object, the present invention provides a computer fan assembly mechanism having filtering and sterilizing functions, which comprises a fan body. An air passageway is formed at a hollow portion in the fan body. The air passageway has an intake and an air vent, which corresponds to a fan located on the fan body. A photo-catalytic net is disposed at the intake. One or more UV LEDs are disposed on the air passageway to illuminate the photo-catalytic net. Through illumination of the UV LEDs on the photo-catalytic net, the object of filtering and sterilizing air passing the intake can be accomplished.

The various objects and advantages of the present invention will be more readily understood from the following detailed description when read in conjunction with the appended drawing, in which:

DETAILED DESCRIPTION OF THE PREFERRED EMBODIMENTS

Figure 1:
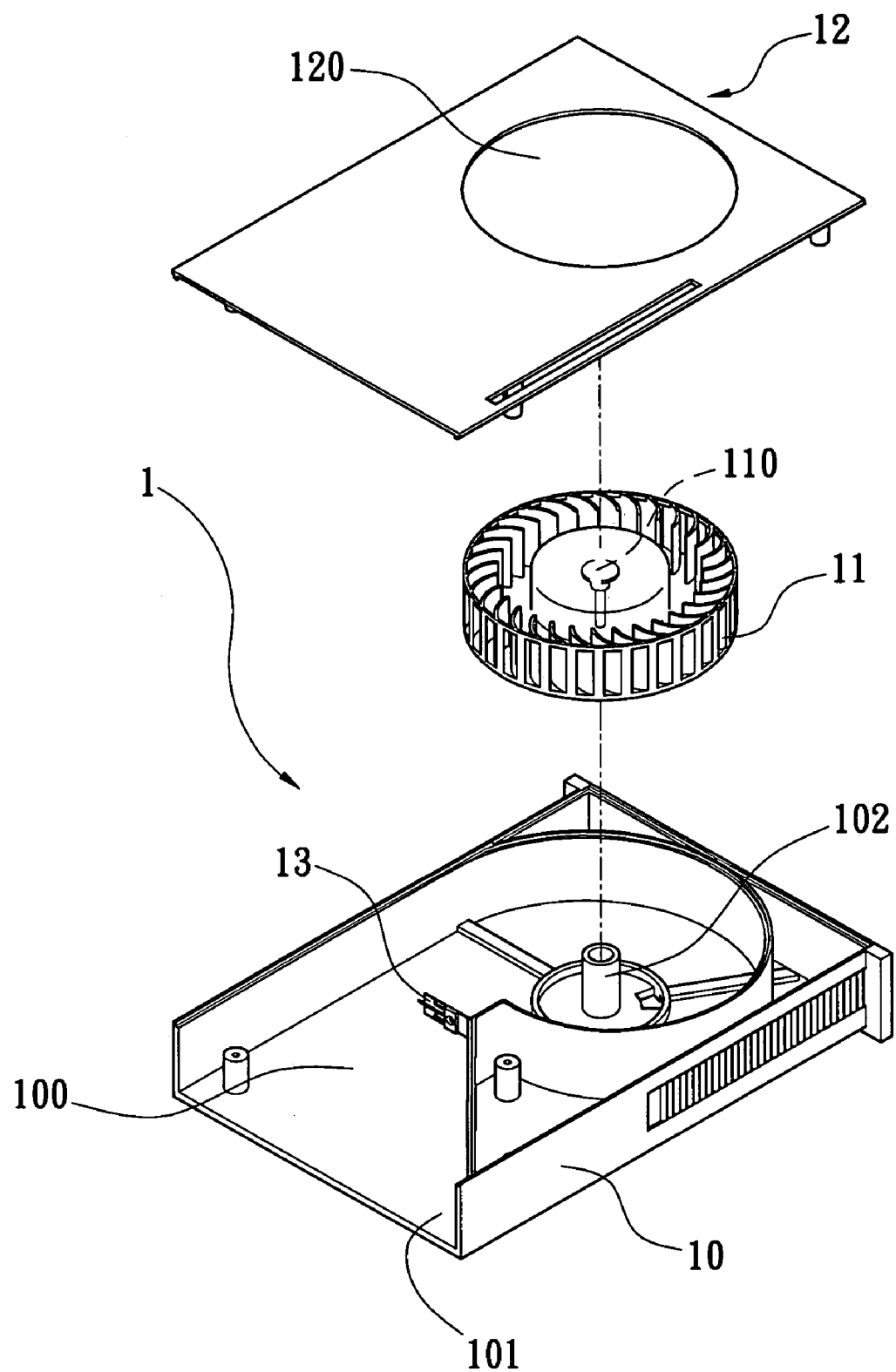
FIG. 1 is an exploded perspective of a first embodiment of the present invention.
Figure 2:
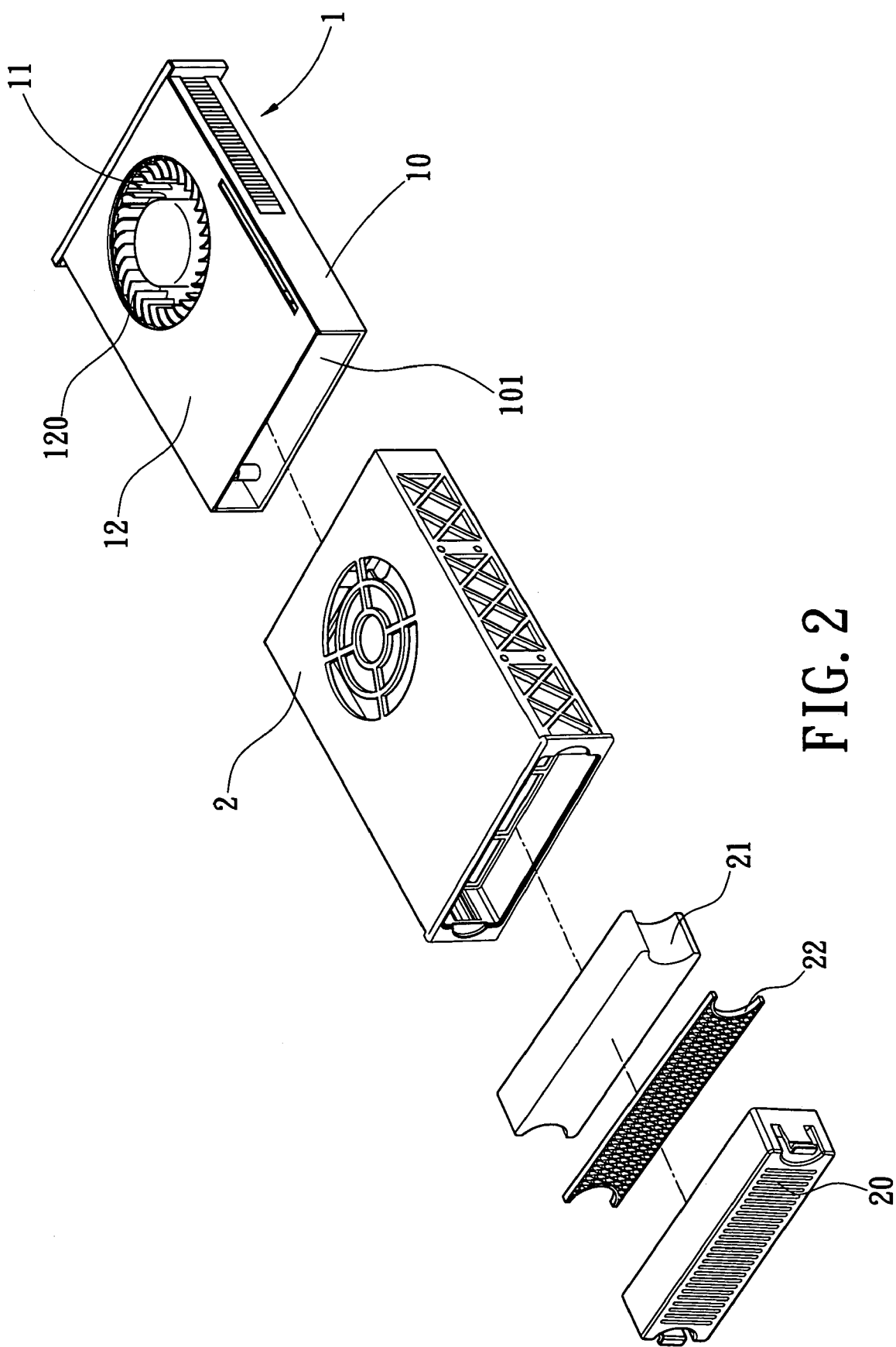
FIG. 2 is an exploded perspective view of the first embodiment of the present invention after a fan frame is added.

As shown in FIGS. 1 and 2, the present invention provides a computer fan assembly mechanism having filtering and sterilizing functions. In this embodiment, a computer fan 1 mainly comprises a box-shaped fan body 10 and a fan 11 having a plurality of blades arranged thereof and pivotally disposed on the fan body. For convenient installation, one face thereof is designed to be a detachable cover plate 12. An air passageway 100 is formed at a hollow portion in the fan body 10. The air passageway 100 has an intake 101. The air passageway 100 can be in an R shape. A fan blade pivot 102 is disposed at the head of the R shape (i.e., the other end opposed to the intake 101). The fan 11 is a spiral centrifugal fan having a central hole. The fan blade pivot 102 can be slipped into the central hole, so that the blades of the fan 11 can rotate on the fan blade pivot 102. An air vent 120 is disposed at a position corresponding to the fan 11. The air vent 120 is perpendicular to the air passageway, and is located on the cover plate 12.

Figure 4:
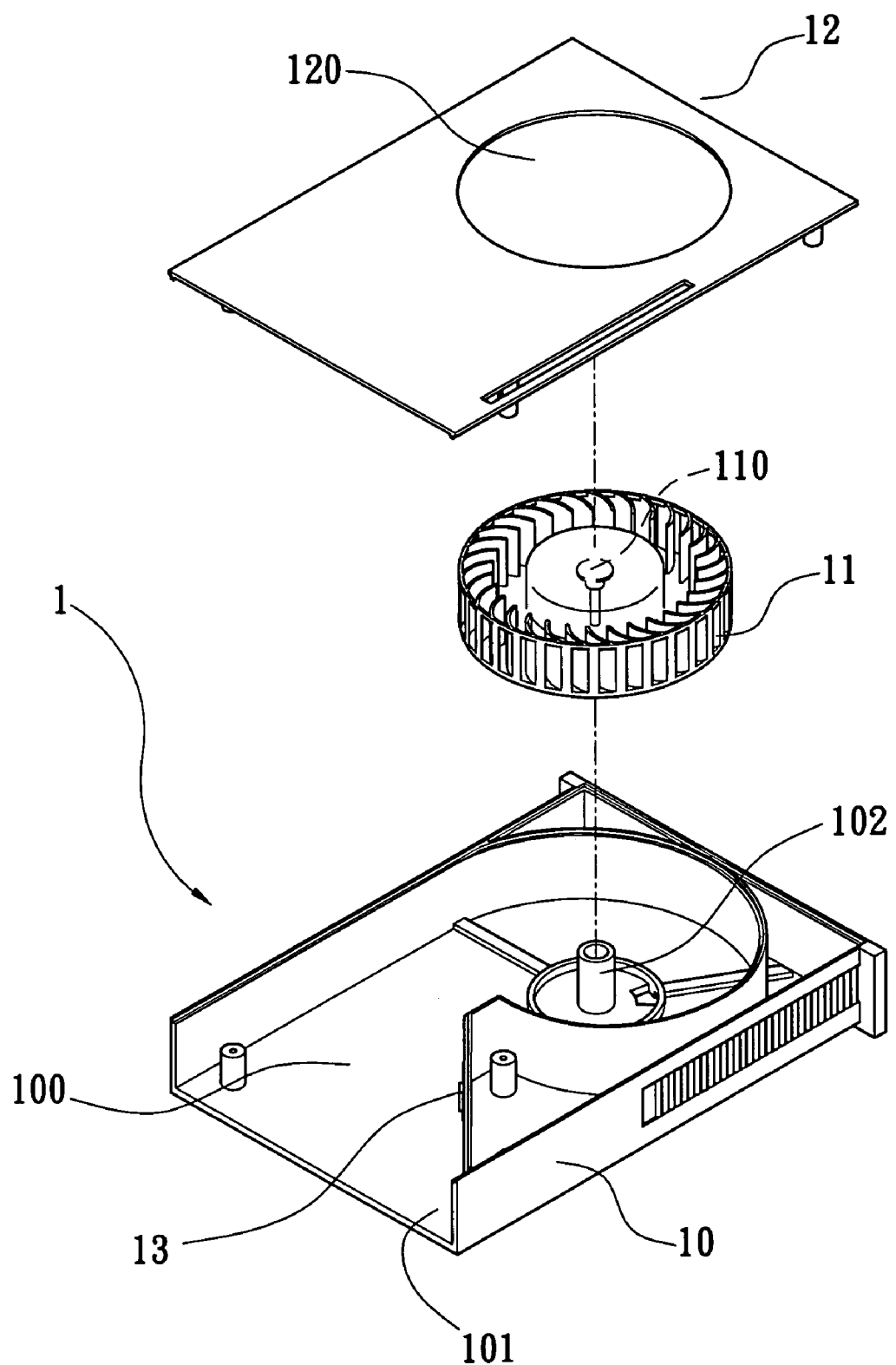
FIG. 4 is an exploded perspective view of a second embodiment of the present invention.

An ultraviolet (UV) LED 13 is disposed on the air passageway 100. The UV LED 13 is arranged to fully illuminate a photo-catalytic net 21. The UV LED 13 can be installed at the middle section of the air passageway 100 in the first embodiment (shown in FIG. 1) or in the distal sidewall of the R-shaped air passageway 100 (shown in FIG. 4) in the second embodiment. Of course the number of the UV LED 13 can be increased according to the necessity.

Figure 3:
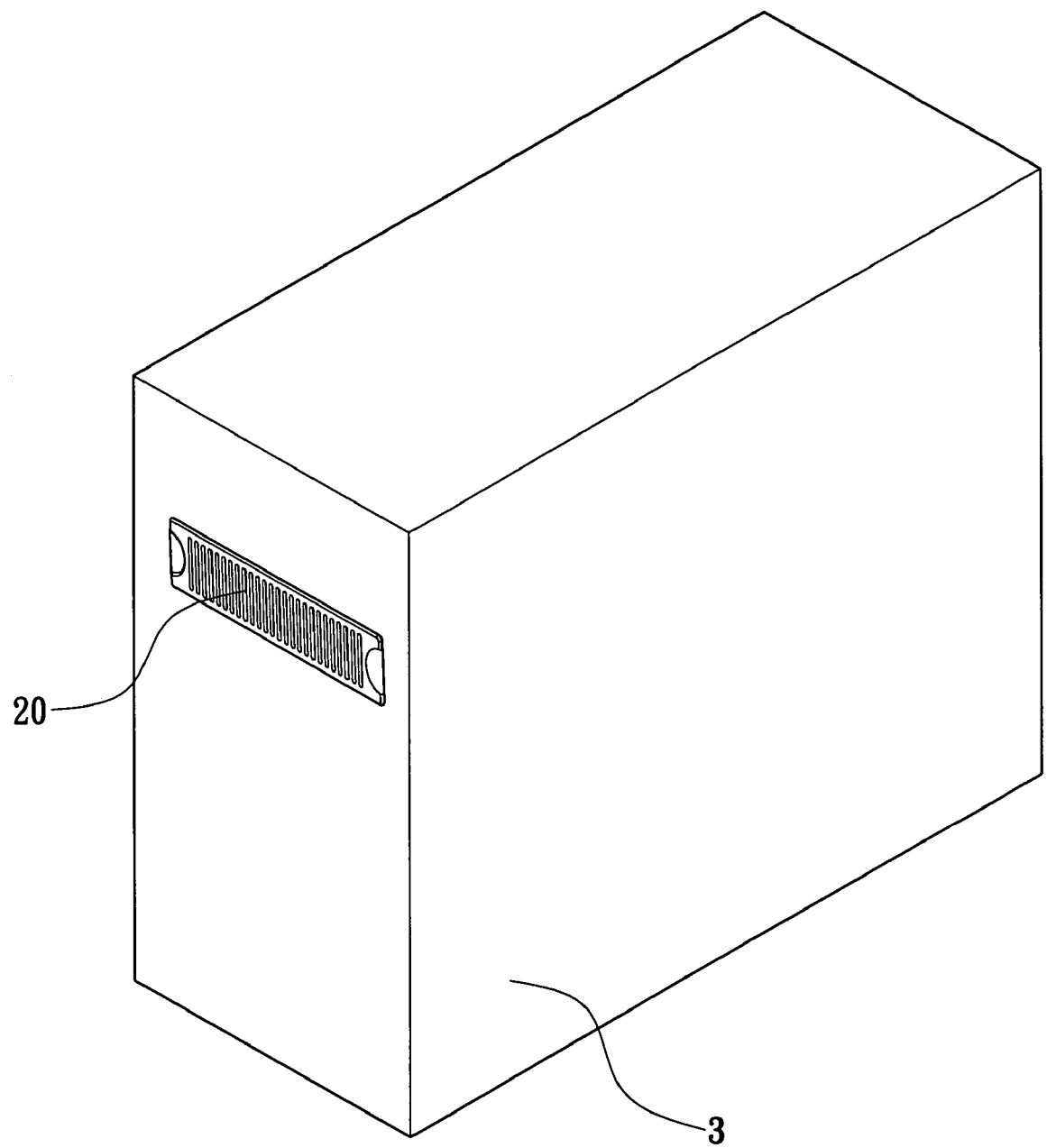
FIG. 3 is a perspective view of the first embodiment of the present invention installed on a computer.

For more convenient installation of the present invention on a computer 3 (shown in FIG. 3), the computer fan 1 further comprises a fan frame 2 (shown in FIG. 2). The hollow portion in the fan frame 2 matches the outer appearance of the fan body 10, so that the fan body 10 can be disposed inside the fan frame 2 A ventilation panel 20 is disposed at a position of the fan frame 2 corresponding to the intake 101. The photo-catalytic net 21 and a filter net 22 or only the photo-catalytic net 21 having filtering and sterilizing functions is disposed between the back face of the ventilation panel 20 and the intake 101 of the fan body 10. The UV LED 13 can thus illuminate the photo-catalytic net 21 to accomplish the object and effect of filtering and sterilizing air passing the intake 101.

Figure 5:
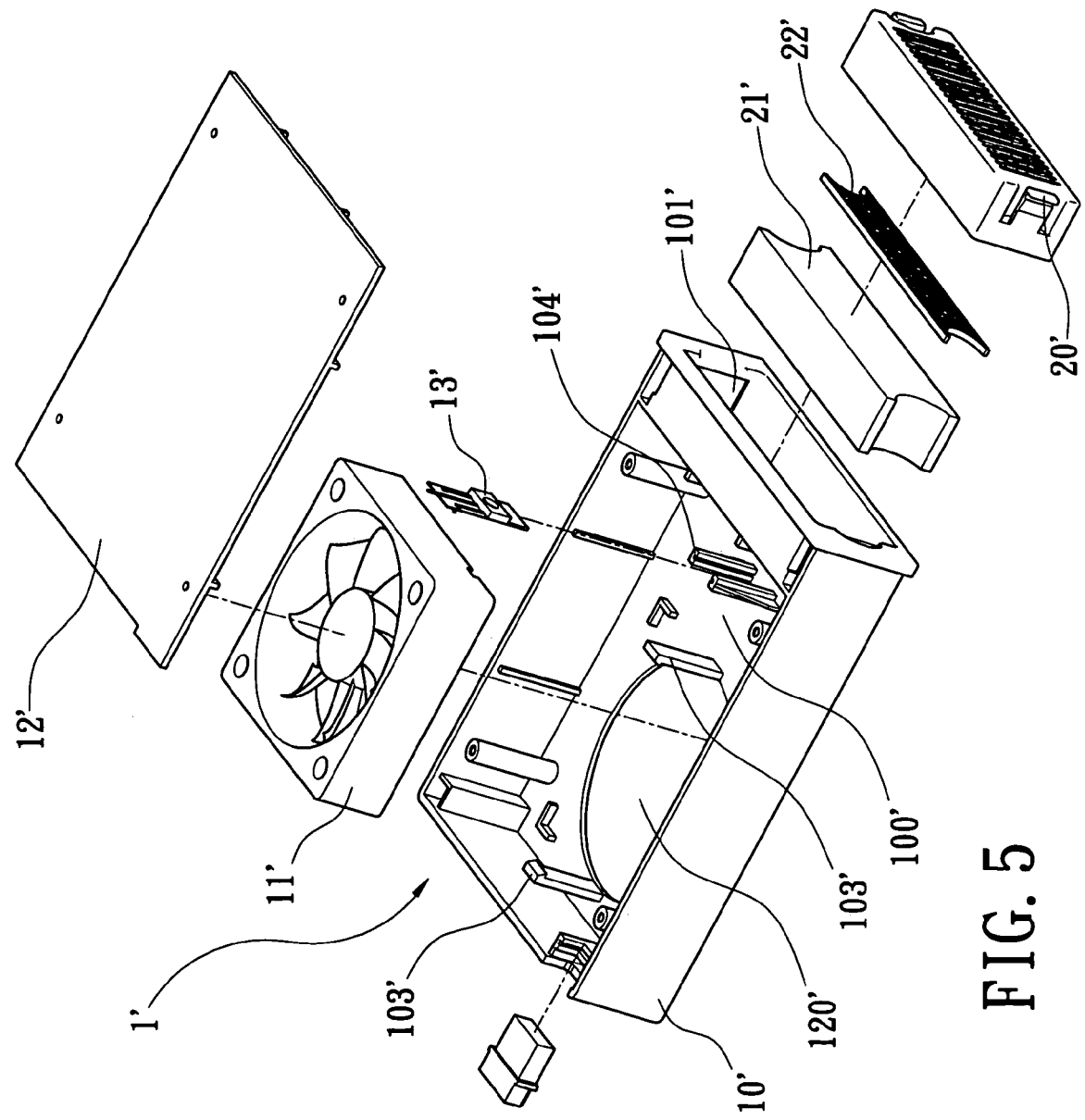
FIG. 5 is an exploded perspective view of a third embodiment of the present invention.

Additionally, FIG. 5 shows a third embodiment of the present invention, a fan 11' of a computer fan 1' is a conventional axial-flow fan. Two fixing components 103' are projective and disposed in a fan body 10'. The fan 11' is disposed in the fan body 10' and is locked between the two fixing components 103'. One face of the fan body 10' is designed to be a detachable cover plate 12' for convenient installation.

The fan body 10' has an intake 101' and an air vent 120'. An air passageway 100' is formed between the intake 101' and the fan 11'. The air vent 120' is perpendicular to the air passageway 100' and corresponds to the fan 11'. A positioning portion 104' is disposed on said air passageway 100' and used to install one or more UV LEDs 13'. A photo-catalytic net 21' and a filter net 22' are disposed on the intake 101', so that the UV LED 13' can fully illuminate the photo-catalytic net 21'. A ventilation panel 20' whose shape and size matching the intake 101' is dispose on the intake 101'.

Figure 6:
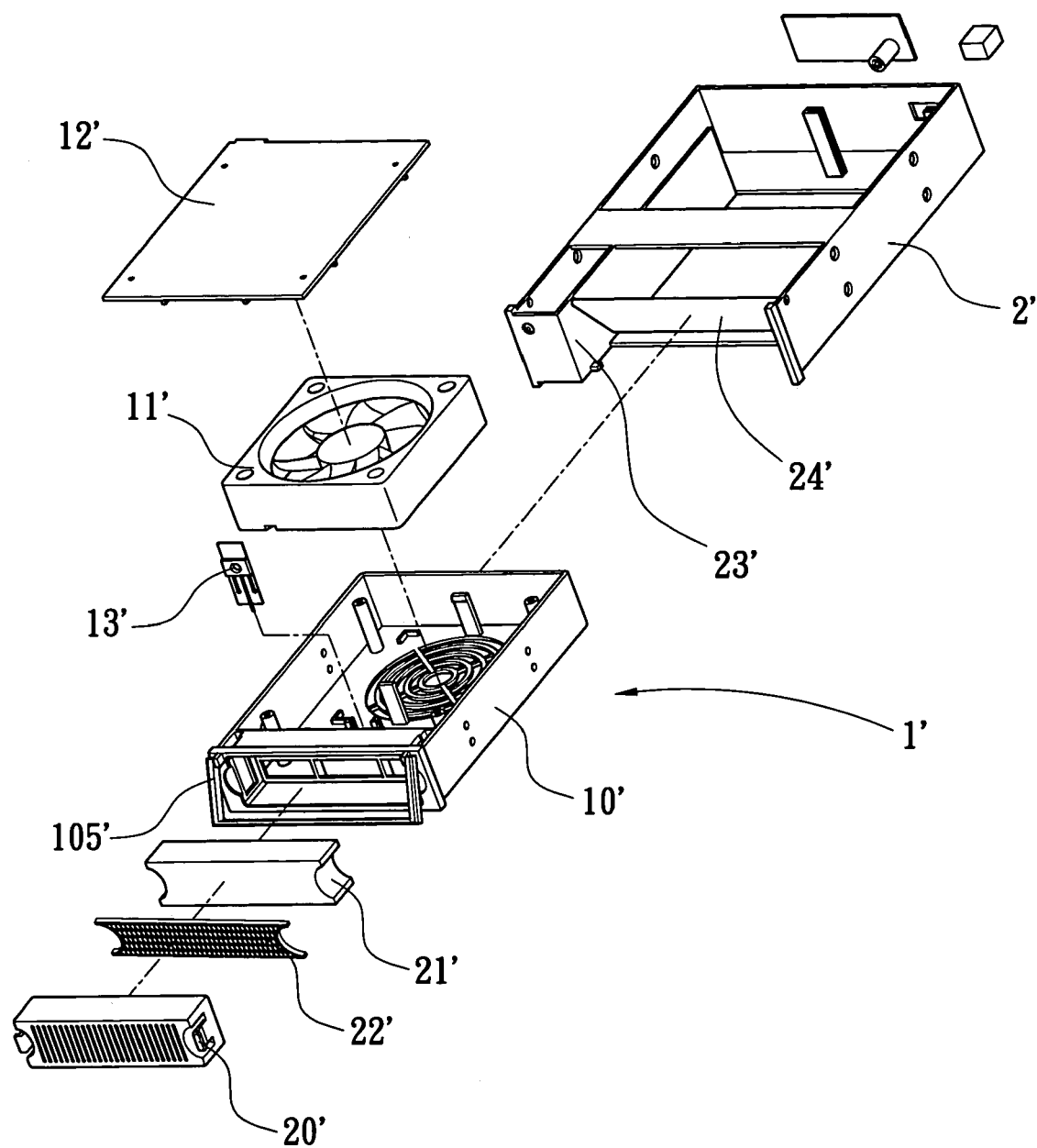
FIG. 6 is an exploded perspective view of the third embodiment of the present invention after a fan frame is added.

FIG. 6 shows a third embodiment further comprises a fan frame for convenient installation. The hollow portion in the fan frame 2' matches the outer appearance of the fan body 10', so that the fan body 10' can be disposed on the fan frame 2'. The fan frame 2' has an entry 23'. A movable cover plate 24' is disposed at a position corresponding to the entry 23'. The movable cover plate 24 can close the entry 23' to avoid intrusion of dusts after the computer fan 1' is extracted. In order to further enhance the convenience of extracting the computer fan 1', a handle 105' can be added on the fan body 10'.

Figure 7:
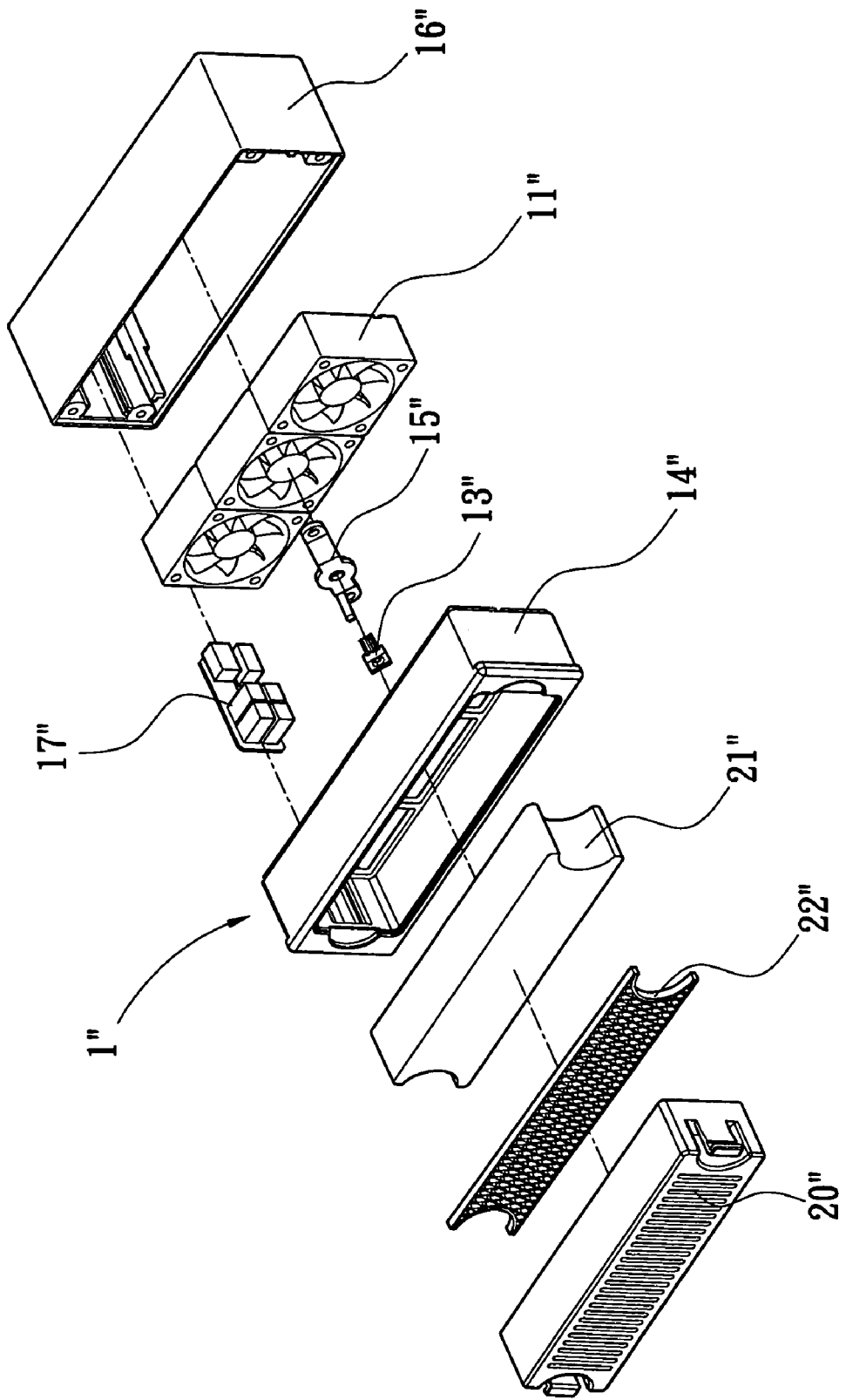
FIG. 7 is an exploded perspective view of a fourth embodiment of the present invention.

FIG. 7 shows a fourth embodiment of the present invention, wherein a computer 1" comprises a ventilation panel 20", a filter net 22", a photo-catalytic net 21", a connection frame 14", a UV LED 13", a bow-shaped holder 15", three parallel arranged fans 11" defining axial-flow fans and disposed in a shell body 16". After the filter net 22" and the photo-catalytic net 21' are slipped into the ventilation panel 20", they are then assembled in the connection frame 14". The UV LED 13" is installed on the bow-shaped holder 15", which is fixedly disposed at the middle one of the fans 11". The fans 11" are received in the shell body 16". The connection frame 14" is locked onto the shell body 16" by screws (not shown). When the connection frame 14" is locked onto the shell body 16", it is necessary to let the filter net 22", the photo-catalytic net 21' and the UV LED 13" placed in the connection frame 14" face one another so that the UV LED 13" can fully illuminate the photo-catalytic net 21". Additionally, a wiring box 17" is further disposed in the shell body 16". The wiring box 17" is adjacent to the side face of the fans 11" located at the outer sides and is assembled in the shell body. 16" together. Electric wires pass through the wiring box 17" to connect the fans 11" and the UV LED 13". Through parallel arrangement of the fans 11", the ventilation effect of the fan can be greatly enhanced to more purify the air.

Figure 8:
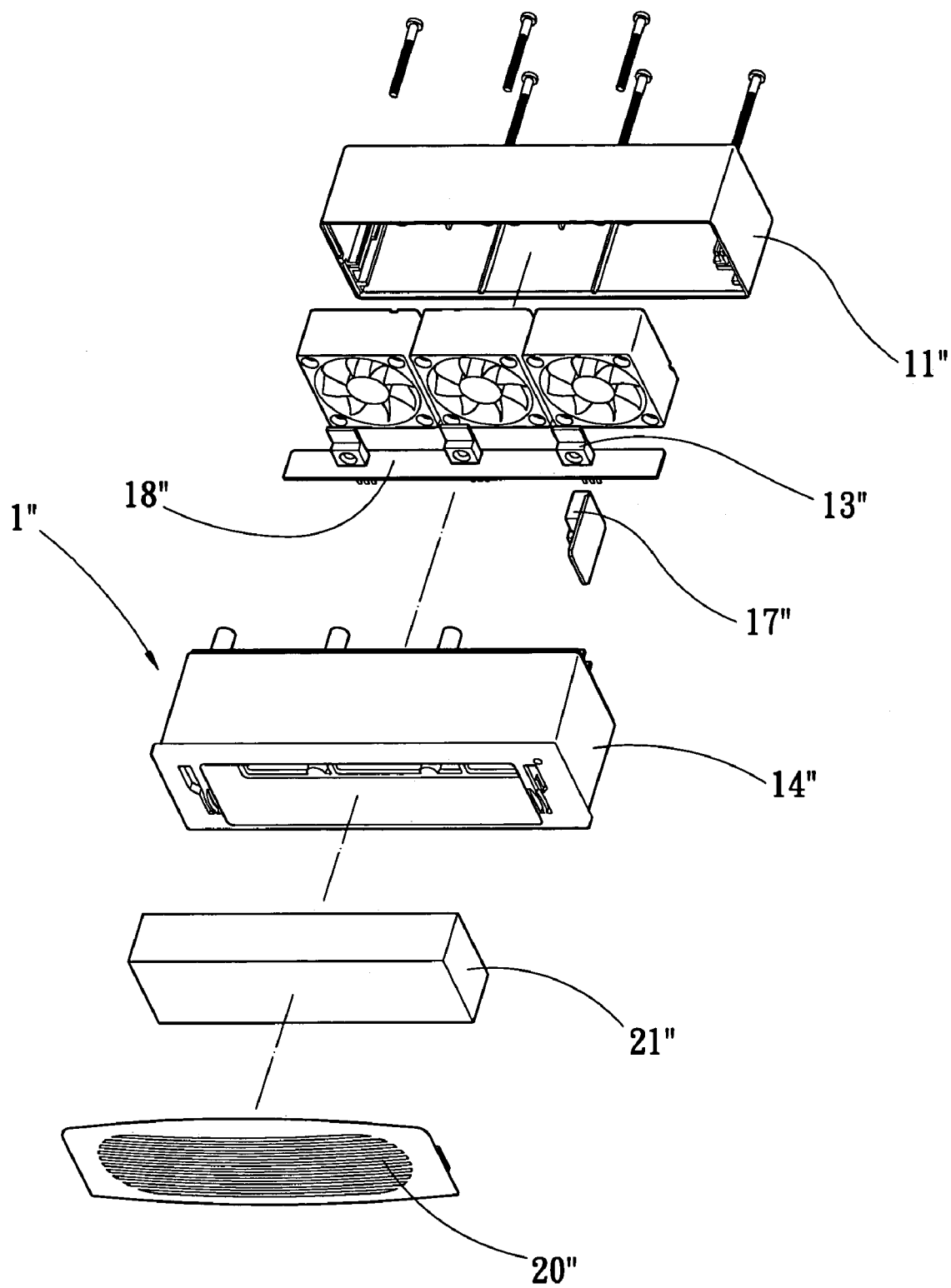
FIG. 8 is an exploded perspective view of a fifth embodiment of the present invention.

FIG. 8 shows a fifth embodiment of the present invention, which has a structure roughly the same as the fourth embodiment. The only difference is that there are three UV LEDs 13" parallel inserted into a printed circuit board (PCB) 18" and the PCB 18" is disposed in front of the fans 11".

The computer fan assembly mechanism having filtering and sterilizing functions, of the present invention at least has the following advantages.

1. Circulation of air can be enhanced to speed up heat-radiating speed.
2. The flow direction of air is changed. Air is sucked in from the intake 101, and is discharged out via through holes of the computer 3. During the sucking process of air, dusts in the air is filtered by the filter net 22 to avoid accumulation dusts inside the computer's components.
3. Through the photo-catalytic net 21 and illumination of the UV LED 13, harmful gases in air like formaldehyde, methylbenzene and methanol can be decomposed cell membranes of bacteria can be destructed to further decompose organic matters in the cells and therefore kill bacteria, and protein rings of viruses can be coagulated to deactivate them and destruct the viruses. Killing rate higher than 90% for bacteria like Klebsiella pneumoniae, clostridium, candida albumin, mucedine, staphylococcus aurcus, colon bacillus and hepatitis B virus. Therefore, air can be refreshed and sterilized to enhance life quality.

Moreover, the present invention can be detached for separate use in a car or a bedroom without the need of buying an air refresher, hence less occupying the space and beautifying the environment.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications intend to be embraced within the scope of the invention as defined in the appended claims.

We claim:

1. A computer fan assembly mechanism having filtering and sterilizing functions, comprising:
    a fan body with a detachable cover plate;
    at least one fan pivotally disposed on the fan body;
    an air passageway being formed at a hollow portion in said fan body; said air passageway having an intake and an air vent;
    a photo-catalytic net being disposed at said intake;
    at least one UV LED disposed on said air passageway to illuminate said photo-catalytic net;
    a fan frame having an entry and a movable cover plate, which is disposed at a position corresponding to said entry, and further including a handle added on said fan body; and
    a filter net disposed between said photo-catalytic net and a ventilation panel, which is disposed at a position of the fan frame corresponding to said intake.

2. The computer fan assembly mechanism having filtering and sterilizing functions as claimed in claim 1, wherein the fan is a spiral centrifugal fan, said air passageway is in an R shape, the fan having a plurality of blades arranged thereof and pivotally disposed on said fan blade pivot, and the UV LED is disposed in a distal sidewall of said R-shaped air passageway or at a middle section of said air passageway.

3. A computer fan assembly mechanism having filtering and sterilizing functions as claimed in claim 1, wherein the fan is an axial-flow fan, said fan body includes two fixing components projective and disposed therein, said axial-flow fan is locked between said two fixing components, said air passageway is formed between said intake and said axial-flow fan, said air vent is located on said fan body, which is perpendicular to said air passageway corresponding to said axial-flow fan, a photo-catalytic net is disposed at said intake, a positioning portion is disposed on said air passageway, and the UV LED is disposed on said positioning portion to illuminate said photo-catalytic net.

4. A computer fan assembly mechanism having filtering and sterilizing functions as claimed in claim 1, wherein the fan is made from plural axial-flow fans which are parallel arranged in shell body, said ventilation panel includes a connection frame assembled therewith and a photo-catalytic net disposed therein, said connection frame has a photo-catalytic net fixedly disposed on said shell body, at least one UV LED disposed on each of said axial-flow fans and arranged to face said photo-catalytic net, and said shell body further has a wiring box disposed therein, and electric wires of said wiring box connect said axial-flow fans and the UV LED, which are disposed on a bow-shaped holder or parallel inserted into a printed circuit board.

* * * * *